United States Patent [19]

Stokowski

[11] Patent Number: 4,824,598

[45] Date of Patent: Apr. 25, 1989

[54] SYNTHETIC LASER MEDIUM

[75] Inventor: Stanley E. Stokowski, Danville, Calif.

[73] Assignee: The United States of America as represented by the United States Department of Energy, Washington, D.C.

[21] Appl. No.: 110,387

[22] Filed: Oct. 20, 1987

[51] Int. Cl.$^4$ .................... C09K 11/80; H01S 3/16
[52] U.S. Cl. ..................... 252/301.4 R; 156/617.1; 372/41
[58] Field of Search .............. 252/301.4 R; 372/41; 156/617 SP

[56] References Cited

U.S. PATENT DOCUMENTS

| | | | |
|---|---|---|---|
| 3,591,517 | 7/1971 | Van Der Ziel et al. | 252/301.4 R |
| 3,633,126 | 1/1972 | Martin et al. | 331/94.5 |
| 4,199,396 | 4/1980 | Brandle et al. | 156/617 SP |
| 4,490,822 | 12/1984 | Walling et al. | 372/41 |
| 4,606,846 | 8/1986 | Kahn et al. | 252/301.4 R |

FOREIGN PATENT DOCUMENTS

| | | | |
|---|---|---|---|
| 3342205 | 5/1985 | Fed. Rep. of Germany | 252/301.4 R |
| 1585679 | 1/1970 | France | 501/64 |
| 56-116681 | 9/1981 | Japan . | |
| 56-116682 | 9/1981 | Japan . | |
| 56-125886 | 10/1981 | Japan . | |

OTHER PUBLICATIONS

Brandle et al. I. "IEEE. J. of Quantum Electronics", vol. QE-10, No. 1, 1974, pp. 67-71.
Drube et al., "Optics Communications", vol. 50, No. 1, 1984, pp. 45-48.
Struve and Huber, "Tunable Room-Temperature CW Laser Action in CR$^{3+}$:GdScGa-Garnet", *Applied Physics B*, vol. 30 (1983), pp. 117-120.
Emmett et al., "The Potential of High-Average-Power Solid State Lasers", Lawrence Livermore Laboratory, Sep. 25, 1984.
Emmett et al., "The Future Development of High--Power Solid State Laser Systems", Physics of Laser Fusion, vol. IV, Lawrence Livermore Laboratory, Nov., 1982.
Honda et al., "Laser Action of Pulse-Pumped Nd$^{3+}$:Gd$_3$Ga$_5$O$_{12}$ at 1.054 m", J. Appl. Phys. 51(2), Feb., 1980, pp. 896-897.
Drube et al., "Tunable Room-Temperature CW Laser Action in Cr$^{3+}$: GdScAl-Garnet", Optics Communications 50:1, May 1, 1984, pp. 45-48.
Stokowski and Shinn, "Large GSSGG:Nd,Cr boule Growth and Quality", Digest of Technical Papers, American Physical Society and Optical Society of America, 1986, p. 43.
Stokowski, "Crystal Growth", Laser Program Annual Report, Lawrence Livermore National Laboratory, Nov. 1986, p. 9-56.
Cockayne et al., "The Growth and Laser Characteristics of Yttrium-Gadolinium-Aluminium Garnet Single Crystals", J. Phys. Chem. Solids, vol. 29, 1968, pp. 905-910.
Bagdasarov et al., "Spectroscopy of the Stimulated Radiation of Gd$_3$Ga$_5$O$_{12}$—Nd$^{3+}$ Crystals", Soviet Physics, 19:6, Dec. 1974, pp. 353-355.
Brandle, Jr. and Vanderleeden, "Growth, Optical Properties, and CW Laser Action of Neodymium-Doped Gadolinium Scandium Aluminum Garnet" IEEE Journal of Quantum Electronics, vol. 10, No. 1, Jan. 1984, pp. 67-71.

*Primary Examiner*—Jack Cooper
*Attorney, Agent, or Firm*—L. E. Carnahan; Roger S. Gaither; Judson R. Hightower

[57] ABSTRACT

A laser medium is particularly useful in high average power solid state lasers. The laser medium includes a chormium dopant and preferably neodymium ions as codopant, and is primarily a gadolinium scandium gallium garnet, or an analog thereof. Divalent cations inhibit spiral morphology as large boules from which the laser medium is derived are grown, and a source of ions convertible between a trivalent state and a tetravalent state at a low ionization energy are in the laser medium to reduce an absorption coefficient at about one micron wavelength otherwise caused by the divalent cations. These divalent cations and convertible ions are dispersed in the laser medium. Preferred convertible ions are provided from titanium or cerium sources.

8 Claims, No Drawings

SYNTHETIC LASER MEDIUM

The invention described herein arose in the course of, or under, prime Contract Number W-7405-ENG-48 between the United States Department of Energy and the University of California.

BACKGROUND OF THE INVENTION

The invention relates to solid state laser medium, particularly to gadolinium scandium gallium garnets, and analogs thereof, used in medium and high average power lasers with large apertures.

Gadolinium scandium gallium garnet, codoped with neodymium and chromium ions, is a leading candidate as a high average power laser medium because it has a high efficiency. The medium couples well to flashlamp pumps, since the chromium dopant absorbs broad energy bands and can transfer the energy to the neodymium dopant as the active lasing ion. Gadolinium scandium gallium garnet has the stoichiometric composition: $Gd_3Sc_2Ga_3O_{12}$. However, in growing large crystals, or boules, problems with growth morphology have been encountered. Thus, spiraling of the boule appears when crystal growth exceeds about one to about two inches of boule diameter. This spiral morphology interferes with laser applications and makes most of the crystal useless.

Garnet materials doped with a rare earth, actinide or transition metal are known in computer applications for magnetic bubble memories and for tunable lasers. U.S. Pat. No. 4,490,822, issued Dec. 25, 1984, inventors Walling et al., discloses a wavelength-tunable laser where the laser medium is a single crystal of $Y_3Ga_5O_{12}$ doped with $Cr^{3+}$. Drube et al., Optics Communications, 50, pp. 45-48 (1984) describes a tunable laser of $Cr^{3+}$ doped $Gd_3Sc_2Al_3O_{12}$. The just-mentioned two publications describe growth of the respective laser medium by the Czochralski technique. Honda et al., J. Appl. Phys., 51, pp. 896-897 (1980) describes neodymium doped $Gd_3Ga_5O_{12}$ crystals also grown by the Czochralski method.

Where the laser medium is utilized in relatively small sizes, such as the 4 mm diameter by 55 mm long rod described by Honda et al. above and the 10 mm diameter by 50 mm long crystal described by Drube et al. above, then the spiral problem generally tends not to occur when a boule is grown. However, in applications where relatively large crystals are desired, then the Czochralski growth technique results in undesired spiral morphology during boule growth over about 2.5 cm boule diameter.

SUMMARY OF THE INVENTION

It is an object of the present invention to provide a composition useful for growing lasable boules from which large crystals can be obtained for uses such as in medium and high average power solid state lasers.

In one aspect of the present invention, a lasing medium useful in solid state lasers comprises a slab having a side or diameter dimension greater than about 2.5 cm but having substantially no spiral morphology associated with growing a boule from which the slab is derived. The slab has an absorption coefficient of less than about 0.01 $cm^{-1}$ at about 1000 nm to about 1200 nm wavelength.

In another aspect of the present invention, a composition useful for growing lasable boules comprises a crystallizable melt with a major portion and an admixed minor portion. The major portion includes

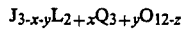

wherein J is gadolinium or yttrium, L is scandium, gallium or aluminum, Q is gallium or aluminum, x is from about −0.20 to about 0, y is from about −0.20 to about 0.5, and z is from about 0 to about 1. The minor portion includes a source of chromium ions as a dopant, a source of divalent ions, and a source of ions convertible between a trivalent state and a tetravalent state at a low ionization energy. The source of divalent ions is in an amount effective to inhibit spiral morphology as the melt crystallizes. The convertible ions are in an amount effective to reduce an absorption coefficient at about 1000 nm to about 1200 nm wavelength when the melt crystallizes.

A synthetic laser medium of the invention is also useful in tunable laser applications. In such applications, the medium will normally not include a codopant such as neodymium ions. Where the medium is designed for medium and high average power solid state laser applications, then effective amounts of a chromium dopant and a neodymium dopant are preferably included.

Other objects and aspects of the invention will become readily apparent to those skilled in the art from the following description.

DETAILED DESCRIPTION OF THE INVENTION

The present invention involves a synthetic medium for laser applications which can be obtained (if desired) in large to very large sizes. By large size is meant that lasing bodies, such as prisms or rods, have a side or diameter, respectively, greater than about 2.5 cm. Preferred synthetic media are parallelepipeds (hereinafter generally referred to "slabs") with the sides generally in the ratio of about 1:10:20 so that the smallest side (that is, the thickness) is at least about 0.25 to 0.5 cm and the longest side is at least about 5 cm. Preferred large slabs on the order of about 0.5 cm×5 cm×9-10 cm have been produced in accordance with the invention. Extremely large slabs (9.5 cm×20 cm with a 1 cm thickness) have also been obtained from boules with diameters of about 12.7 cm.

Large slabs may be taken as axially cut sections from boules with diameters of at least 2.5 cm, more preferably at least about 5 cm, such that the longest slab side is taken along the long boule axis. Slabs, rods and the like of varying sizes and configurations (large or small) may be prepared, since spiral growth in the boules is avoided.

A synthetic laser medium in accordance with the invention has a primary composition with the formula illustrated by Formula I.

FORMULA I

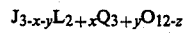

wherein J is gadolinium or yttrium, L is scandium, gallium or aluminum, Q is gallium or aluminum, x is from about −0.20 to about 0, y is from about −0.20 to about 0.5, and z is from about 0 to about 1. The Formula I primary composition is sometimes hereinafter referred to as "gadolinium scandium gallium garnet and analogs".

By "primary" composition is meant that at least a majority of the body has the Formula I composition, and more typically the body can be viewed as substantially entirely the Formula I composition. A dispersed secondary composition is dispersed in the primary composition and includes small amounts of ionic species for the purposes to be hereinafter more fully described.

A particularly preferred primary composition is wherein J is gadolinium, L is scandium, Q is gallium, and the Formula I composition is substantially congruent both as melt and as growing crystal. Such a congruent composition is illustrated by Formula II.

FORMULA II

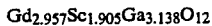

$$Gd_{2.957}Sc_{1.905}Ga_{3.138}O_{12}$$

As may be seen, the congruent composition differs only slightly from a stoichometric composition: $Gd_3Sc_2Ga_3O_{12}$. However, it has been found that use of the congruent composition minimizes growth striations when compared to the stoichometric composition.

The secondary composition, or minor portion, is incorporated in the crystallizable melt, such as by admixing, so that the secondary composition is dispersed in the primary composition of the body. The dispersed secondary composition is relatively uniformly distributed, but there has been found some variation (about 10-15 percent) in very large boules.

The secondary composition necessarily includes a chromium dopant in ionic form. This chromium dopant is in an amount of at least $0.1 \times 10^{20}$ ions/cc of the body so that the desired $Cr^{3+}$ is in a sufficient amount to absorb broad energy bands. More preferably, the chromium dopant is in a range of about $0.5 \times 10^{20}$ to about $4 \times 10^{20}$ ions/cc.

The spiraling problem is reduced or eliminated by the addition of a second ionic species as part of the secondary composition during boule growth. The second species is one or more divalent cations in an amount effective to inhibit spiral morphology during boule growth, and preferably is in an amount at least about 25 ppm with respect to the body. Suitable divalent cations include alkaline-earth metals, e.g., strontium, barium, calcium, and magnesium, and transition metals such as nickel, cobalt and manganese. The divalent cations preferably are in an amount at least about 25 ppm with respect to the body, and a preferred range is from about 25 ppm to about 125 ppm; however, amounts up to about 600 ppm have been utilized.

While amounts of such divalent cations have been shown effective to inhibit or eliminate spiral morphology, unfortunately a new problem was found to emerge. That is, lasing media including the divalent cations to reduce spiral morphology exhibit one (or more) absorption bands, at wavelengths between about 1000 nm and 1200 nm, which introduces an unacceptable loss at the neodymium laser wavelength of 1.061 microns, and also generally reduces efficiency of lasing. Thus, although reduction in spiral morphology is believed to depend directly on the concentration of the divalent cations, one problem is solved only to introduce another. For example, inclusion of 600 ppm $Ca^{2+}$ into the Formula II congruent composition, doped with chromium and neodymium, has been found to have an absorption coefficient (which appears as a band having a suggestion of two peaks between 1000 nm and 1200 nm wavelength) of about 30 $cm^{-1}$. It is believed that this absorption band is caused by $Cr^{4-}$ formed from $Cr^{3+}$, which formation is believed to be promoted by the divalent cations. The wavelength over which or within such an absorption coefficient occurs will hereinafter be generally referred to as the "about one micron wavelength".

Compositions of the invention include ions convertible between a trivalent state and a tetravalent state at a low ionization energy and in an amount effective to reduce the absorption coefficient at the about one micron wavelength. The convertible ions are believed to be in a chemical equilibrium such that both trivalent and tetravalent species are present.

Suitable such convertible cations are from sources of titanium, cerium or terbium. Cerium appears to have the least effect on growth morphology, and is thus particularly preferred. Such convertible cations are preferably in a weight ratio with respect to the divalent cations from about 2:1 to about 6:1. Use of such weight ratios generally reduces the absorption coefficient at the one micron wavelength to less than about 0.01 $cm^{-1}$ for at least portions of the boule from which slabs can be cut.

The synthetic laser medium of the invention is grown from a crystallizable melt which includes the dopant or dopants, the divalent cations (from sources such as calcium carbonate, strontium carbonate, magnesium carbonate, barium carbonate, nickel oxide, cobalt oxide and manganese oxide), and the convertible ions (from sources such as cerium dioxide, titanium dioxide, terbium oxide, $Ce_2O_3$, $Ti_2O_3$ and $Tb_2O_3$). The carbonates are normally preferred over the oxides for the divalent cation sources due to stability, but oxides of all may be utilized. The Czochralski growth technique may be utilized with such a crystallizable melt to grow lasable boules of the desired size displaying little or no spiral morphology, as will now be more fully described.

GROWTH PROCEDURE

In the Czochralski growth technique, the crystalline boule solidifies from its melt. The melt is contained within an iridium crucible which is heated by electrical induction by a surrounding coil connected to a power supply. Between the coil and crucible is thermal insulation, typically granular or solid zirconia.

The crystallization process is initiated by attaching a crystal seed to the top of the melt. This seed is attached to a rod suspended above the melt. The seed/rod attachment is rotated at a rate usually between 10 and 30 rpm. As the crystal grows, the crystal boule is pulled from the melt at a rate between about 0.5 and 5 mm/hr. The atmosphere in the growth system is 1 to 3 percent $O_2$ in $N_2$ or in some cases 15 to 25 percent $CO_2$ in $N_2$.

In accordance with the invention, the raw materials for crystal growth are generally the oxides of the primary constituents, e.g., $Gd_2O_2$, $Ga_2O_3$ and $Sc_2O_3$. The raw materials and the dopant source(s) come in the form of powders. The powders are compressed and heated to about 1000° C. to dehydrate them. The raw materials and dopant(s) are admixed to form the starting charge ready for melting in the iridium crucible. The starting charge is typically 50 kg placed in a nine inch diameter by nine inch deep iridium crucible. The sources of divalent cations and convertible cations are similarly dehydrated and admixed with the starting charge before forming the melt. The starting charge is heated to about 1860° C. and forms the melt which includes the necessary divalent cations and convertible cations dispersed in the melt.

It has been discovered that heating the boule in a reducing atmosphere, such as in a 1:1 ratio of CO and $CO_2$ or more preferably in a 0.05:0.5 percent ratio of $H_2$ in argon, for twelve to twenty-four hours at 1300° C. before cooling the boule assists in further reducing the one micron absorption band. This may be because the boule otherwise reacts with an oxygen atmosphere during cooling. The boule is preferably then cooled in an inert atmosphere such as dry nitrogen.

The boule surface may be polished to facilitate inspection. Inspection is preferably conducted by measuring the absorption coefficient at one micron wavelength at different locations of the boule.

Slabs from predetermined locations in the boule are then obtained and polished. A preferred polishing compound is a mixture of 150 g $TiO_2$ (anatase form) and 100 mg colloidal silica per liter of water to provide smooth, high-strength surfaces. The slabs may be polished using a continuous polisher, as is well known to the art.

Slabs (or rods) of the desired dimensions for the specific application may be measured to determine the absorption coefficient at the one micron wavelength. If the absorption coefficient is greater than about 0.005 $cm^{-1}$, then the slab is preferably heat treated in a reducing atmosphere, such as an atmosphere of 0.05 to 0.5 percent $H_2$ in argon for 24 hours at 1300° C.

The slab may then be cut and polished to the final dimensions and the required flatness. Edge cladding is preferred to suppress spontaneous emission and parasitic oscillations by applying to slab edges an absorbing glass matching the slab in refractive index and thermal expansion.

APPLICATIONS WITH HIGH AVERAGE POWER LASER

By "high average power" is meant an average of 500 or greater watts. By "medium average power" is meant an average between about 10 watts to about 500 watts. "Low average power" means up to about 10 watts.

Slabs in accordance with the invention are particularly useful in high average power lasers. These lasers have two main types of geometry, a zig-zag configuration and a disk configuration. In the zig-zag configuration, the laser beam propagates internally through the slab at angles perpendicular to the entry and extraction faces such that the beam bounces off the slab's large (usually rhomboid configured) surfaces by total internal reflection. The zig-zag configured laser is also described by Martin et al., U.S. Pat. No. 3,633,126, issued Jan. 4, 1972. In the disk configuration, the laser beam propagates through the disk thickness at the Brewster angle, which is that angle where no reflection occurs at the disk surface. As may be understood, the synthetic laser medium of the invention can provide more surface through which the slab, or body, can be pumped.

A high average power laser of the zig-zag configuration is known and uses YAG garnet (grown from $Y_3Al_5O_{12}$ having $Nd^{3+}$ dopant). The synthetic laser medium of the present invention is about two to about four times as efficient as such YAG garnet.

The synthetic laser medium is cooled by a coolent, such as water, flowing across the large slab faces. The laser medium is pumped or excited by flash lamps located on each side of the laser medium. Reflectors around the flash lamps increase the intensity of the pump light at the slab surface. This surface acts as either a laser oscillator or an amplifier, depending on the arrangement of the surrounding optical system.

High average power lasers are also discussed by J. L. Emmett et al., "The Future Development of High Average Power Solid State Laser Systems", UCRL No. 53344, November 1982, and J. L. Emmett et al., "The Potential of High Average Power Solid State Lasers", UCRL No. 53571, September 1984.

EXAMPLE I

A boule was grown having the following melt composition:

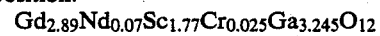

The dopants were added as 110 ppmw equivalent of Ca metal and 440 ppmw of Ce metal. The resulting boule had a 13 cm diameter and a 11 cm length. The boule was grown without spiraling. Thus, for example, from this boule, a 5 cm×9 cm×0.5 cm slab was fabricated for use in a zig-zag configured high average power (about 200 watts) laser system. Before cutting the slab, the boule was inspected and found to have an absorption coefficient at one micron wavelength which varied from 0.007 to 0.08 $cm^{-1}$ within the boule. Slabs are preferentially taken at the lower absorption coefficient portions. This slab was then heated in a 0.5 percent $H_2$ in argon atmosphere for twenty-four hours, after which the one micron wavelength absorption was less than 0.0025 $cm^{-1}$. A relatively small slab was also cut from this boule (0.6 cm thick, 1 $cm^2$ slab faces) and analogously heat treated. This relatively small slab had an absorption coefficient at the one micron wavelength of about 0.0007 $cm^{-1}$.

EXAMPLE II

For comparison with Example I, a boule was grown having an analogous melt composition to that of Example I, but without the convertible ions (here, without the cerium ions). This comparative boule had an absorption coefficient at one micron wavelength which varied from 1.2 to 2 $cm^{-1}$ within the boule. Despite analogous heat treating to Example I, these comparative slabs had unacceptably high (0.4 $cm^{-1}$) absorption coefficients.

EXAMPLE III

A boule was grown having the following melt composition:

The dopants were 62 ppmw equivalent of Ca metal and 300 ppmw equivalent of Ce metal. The boule grew without spiralling to dimensions of 9.5 cm diameter×20.5 cm long. The absorption coefficient of the boule as grown varied from 0.01 to 0.08 $cm^{-1}$. A slab of 9.5×19.5×0.65 $cm^3$ was cut from this boule and will be heat treated before use. As with Example I, a smaller slab was also cut and heat treated for an absorption coefficient at the one micron wavelength of about 0.004 $cm^{-1}$.

While specific embodiments of compositions of the present invention have been illustrated and described, modifications and changes will become apparent to those skilled in the art, and the appended claims are intended to cover all such modifications and changes which come within the scope of this invention.

What is claimed is:

1. A synthetic laser medium comprising:
   a body having a primary composition and a secondary composition, the body's absorption coefficient at about one micron wavelength being less than about 0.01 cm$^{-1}$, the primary composition being $$J_{3-x-y}L_{2+x}Q_{3+y}O_{12-z}$$

wherein J is gadolinium or yttrium, L is scandium, gallium or aluminum, Q is gallium or aluminum, x is from about −0.20 to about 0, y is from about −0.20 to about 0.5, and z is from about 0 to about 1;

the secondary composition having ionic species dispersed in the primary composition, the ionic species including a chromium dopant in an amount of at least $0.1 \times 10^{20}$ ions/cc of the body to absorb broad energy bands and a neodymium codopant in an amount effective to actively lase, divalent cations in an amount at least about 25 ppm with respect to the body and being $Mg^{2+}$, $Sr^{2+}$, $Ba^{2+}$, $Mn^{2+}$, $Ca^{2+}$, $Ni^{2+}$, or $Co^{2+}$, and convertible cations in an amount effective to reduce the absorption coefficient of the body at about one micron wavelength, the convertible cations being Ti, Ce or Tb in the trivalent state, tetravalent state or mixtures thereof.

2. The medium as in claim 1 wherein the chromium dopant is in an amount from about $0.1 \times 10^{20}$ to about $4 \times 10^{20}$ ions/cc of the body.

3. The medium as in claim 3 wherein the convertible cations are in a weight ratio with respect to the divalent cations of from about 2:1 to about 6:1.

4. The medium as in claim 1 wherein the body has a side greater than about 2.5 cm or a diameter greater than about 2.5 cm.

5. The medium as in claim 4 wherein the chromium and neodymium codopants together total from about $0.6 \times 10^{20}$ to about $8 \times 10^{20}$ ions/cc of the body and the convertible cations are in a weight ratio with respect to the divalent cations of from about 2:1 to about 6:1.

6. In a method for preparing a laser medium having a primary composition $J_{3-x-y}L_{2+x}Q_{3+y}O_{12-z}$ wherein J is gadolinium or yttrium, L is scandium, gallium or aluminum, Q is gallium or aluminum, x is from about −0.20 to about 0, y is from about −0.20 to about 0.5, and z is from about 0 to about 1, being doped with chromium ions and with neodymium ions from a crystallizable melt by the Czochralski growth techniques, the improvement comprising:

incorporating divalent cations and convertible cations into the crystallizable melt and forming a boule therefrom, the divalent cations are in an amount at least about 25 ppm with respect to the boule and being $Mg^{2+}$, $Sr^{2+}$, $Ba^{2+}$, $Mn^{2+}$, $Ca^{2+}$, $Ni^{2+}$, or $Co^{2+}$, the convertible cations consisting of titanium, cerium or terbium in the trivalent state, tetravalent state or mixtures thereof, the convertible cations being in a weight ratio with respect to the divalent cations of from about 2:1 to about 6:1.

7. The method as in claim 6 further comprising:
heating the boule in a reducing atmosphere at a temperature effective to reduce the absorption coefficient of the boule at about one micron wavelength.

8. The method as in claim 6 further comprising:
cooling the boule in an inert atmosphere.

* * * * *